(12) United States Patent
Graf et al.

(10) Patent No.: US 8,304,290 B2
(45) Date of Patent: Nov. 6, 2012

(54) OVERCOMING LAMINATE WARPAGE AND MISALIGNMENT IN FLIP-CHIP PACKAGES

(75) Inventors: Richard S. Graf, Research Triangle Park, NC (US); Thomas E. Lombardi, Research Triangle Park, NC (US); Sudipta K. Ray, Research Triangle Park, NC (US); David J. West, Research Triangle Park, NC (US)

(73) Assignee: International Business Machines Corporation, Armonk, NY (US)

( * ) Notice: Subject to any disclaimer, the term of this patent is extended or adjusted under 35 U.S.C. 154(b) by 47 days.

(21) Appl. No.: 12/642,479

(22) Filed: Dec. 18, 2009

(65) Prior Publication Data
US 2011/0151627 A1    Jun. 23, 2011

(51) Int. Cl.
*H01L 21/00*    (2006.01)
(52) U.S. Cl. .......................... 438/121; 257/779
(58) Field of Classification Search .................. 438/121, 438/106, 26, 51; 257/779
See application file for complete search history.

(56) References Cited

U.S. PATENT DOCUMENTS

| | | | |
|---|---|---|---|
| 3,871,015 A | 3/1975 | Lin et al. | |
| 5,497,258 A * | 3/1996 | Ju et al. | 349/58 |
| 5,926,731 A * | 7/1999 | Coapman et al. | 438/613 |
| 7,008,867 B2 | 3/2006 | Lei | |
| 7,122,403 B2 | 10/2006 | Chandran et al. | |
| 7,235,886 B1 | 6/2007 | Chandran et al. | |
| 7,468,316 B2 | 12/2008 | Lee et al. | |
| 2001/0013423 A1* | 8/2001 | Dalal et al. | 174/260 |
| 2002/0064933 A1* | 5/2002 | Ueoka | 438/615 |
| 2007/0205253 A1* | 9/2007 | Hubner | 228/193 |
| 2008/0157356 A1 | 7/2008 | Yeohi et al. | |
| 2008/0280396 A1* | 11/2008 | Kim et al. | 438/109 |
| 2009/0095502 A1 | 4/2009 | Jadhav et al. | |

FOREIGN PATENT DOCUMENTS
JP    01039043 A    2/1989

OTHER PUBLICATIONS

A. Yeoh et al, "Copper die bumps (first level interconnect) and low-K dielectrics in 65nm high volume manufacturing", IBM Electronics Components and Technology Conference 2006, pp. 1611-1615.

(Continued)

*Primary Examiner* — Shaun Campbell
(74) *Attorney, Agent, or Firm* — Kunzler Law Group PC

(57) ABSTRACT

An apparatus, system, and method are disclosed for connecting an integrated circuit device to a substrate. A plurality of standard diameter pillars and three or more increased diameter pillars are disposed on an integrated circuit device. The increased diameter pillars have a diameter that is greater than the standard diameter pillars and a height that is similar to the standard diameter pillars. The standard diameter pillars and the increased diameter pillars form a pattern on the integrated circuit device that corresponds to contact pads on a substrate opposite the integrated circuit device. A first group of solder bumps is disposed between the standard diameter pillars and the contact pads. A second group of solder bumps is disposed between the increased diameter pillars and the contact pads. The second group of solder bumps has pre-connection heights that are greater than pre-connection heights of the first group of solder bumps.

25 Claims, 8 Drawing Sheets

OTHER PUBLICATIONS

A. Wong et al, "Copper flip chip bump interconnect technology for microwave subsystems including RF characterization", IBM Electronics Components and Technology Conference 2000, pp. 335-338.

B. Banijamali, "Reliability of fine-pitch flip-chip packages," IBM Electronics Components and Technology Conference 2009, pp. 293-300.

* cited by examiner

OVERCOMING LAMINATE WARPAGE AND MISALIGNMENT IN FLIP-CHIP PACKAGES

BACKGROUND

1. Field of the Invention

This invention relates to flip-chip packages and more particularly relates to overcoming laminate warpage and misalignment in flip-chip packages.

2. Description of the Related Art

Flip-chips, or Controlled Collapse Chip Connection ("C4") chips, are semiconductor devices that are attached to an external substrate by an array of contacts on the chip. The connections between the contacts on the chip and pads on the external substrate are usually made using solder. Solder, however, has poor electromigration performance. Electromigration in solder joints causes a gradual movement of ions within the solder, which can lead to decreased reliability and eventual loss of the connection and failure of the entire circuit.

Using less solder in the flip-chip interconnects can minimize the effects of electromigration. Decreasing the amount of solder, however, increases alignment issues and substrate warpage issues between the flip-chip and the substrate. When less solder is used, flip-chip misalignment and substrate warpage can cause failed, non-wet connections between the flip-chip and the substrate, as there is not enough solder to compensate for the misalignment or for the variation in contact pad heights on the substrate due to substrate warpage.

To compound the issue, modern high-performance chips have higher connection counts. To accommodate more connections, flip-chips often have decreased pitches, or distances between contacts, or even smaller contacts themselves. This smaller scale amplifies even the smallest chip misalignment or substrate warpage. Additionally, to meet the demands of these high density chips, substrates are becoming thinner, with higher density signal traces and vias. Organic laminates are often used for these flip-chip package substrates. Organic laminate substrates are much more subject to warpage than are ceramic substrates. There is also a larger coefficient of thermal expansion ("CTE") mismatch between organic laminate substrates and silicon than between ceramic substrates and silicon. Further, the warpage in organic laminates is not consistent, and can vary in shape and severity even between individually diced laminate blocks cut from a single laminate panel.

BRIEF SUMMARY

From the foregoing discussion, it should be apparent that a need exists for an apparatus, system, and method that overcome electromigration, chip misalignment, and substrate warpage in flip-chip packages. Beneficially, such an apparatus, system, and method would minimize the use of solder in flip-chip connections while compensating for chip misalignment and substrate warpage.

The present invention has been developed in response to the present state of the art, and in particular, in response to the problems and needs in the art that have not yet been fully solved by currently available flip chip connections. Accordingly, the present invention has been developed to provide an apparatus, system, and method for connecting an integrated circuit device to a substrate that overcome many or all of the above-discussed shortcomings in the art.

The apparatus to connect an integrated circuit device to a substrate is provided with a plurality of elements configured to functionally connect the integrated circuit device to the substrate. These elements in the described embodiments include a plurality of standard diameter pillars, three or more increased diameter pillars, a first group of solder bumps, and a second group of solder bumps.

The plurality of standard diameter pillars and the three or more increased diameter pillars, in one embodiment, are electrically conductive, and are disposed on an integrated circuit device. In a further embodiment, the increased diameter pillars have a height that is similar to a height of the standard diameter pillars. In another embodiment, the increased diameter pillars have a diameter that is greater than a diameter of the standard diameter pillars. The standard diameter pillars and the increased diameter pillars, in one embodiment, form a pattern on the integrated circuit device that corresponds to a plurality of electrically conductive contact pads disposed on a substrate that is opposite the integrated circuit device. The substrate, in one embodiment, comprises an organic laminate.

In one embodiment, the first group of solder bumps is disposed between the standard diameter pillars and contact pads corresponding to the standard diameter pillars. The second group of solder bumps, in another embodiment, is disposed between the increased diameter pillars and contact pads corresponding to the increased diameter pillars. In a further embodiment, solder bumps in the second group of solder bumps have a pre-connection height that is greater than a pre-connection height of the first group of solder bumps.

The second group of solder bumps, in one embodiment, comprises initial pre-connection contact points between the increased diameter pillars and the corresponding contact pads due to the greater pre-connection height of the second group of solder bumps. In another embodiment, the second group of solder bumps and the increased diameter pillars are sized such that, in response to the second group of solder bumps melting, a surface tension between the second group of solder bumps and the increased diameter pillars pulls the contact pads and the pillars into alignment to compensate for initial misalignment. In a further embodiment, the second group of solder bumps and the increased diameter pillars are sized such that, in response to the second group of solder bumps melting, a surface tension between the second group of solder bumps and the increased diameter pillars pulls the first group of solder bumps into contact with both the contact pads and the standard diameter pillars to compensate for warpage in the substrate.

In one embodiment, the increased diameter pillars are each disposed toward an edge of the pattern of pillars on the integrated circuit device. In another embodiment, the increased diameter pillars are each disposed at a corner of the pattern of pillars on the integrated circuit device. In one embodiment, the standard diameter pillars and the increased diameter pillars comprise copper. In another embodiment, the standard diameter pillars and the increased diameter pillars comprise a copper alloy. In a further embodiment, the standard diameter pillars and the increased diameter pillars further comprise a surface layer of plating.

In one embodiment, the solder bumps from the first and second groups of solder bumps are attached to at least one of a pillar and a contact pad prior to connection of the pillars and the contact pads. In a further embodiment, solder bumps from the first and second groups of solder bumps are attached to each of the contact pads prior to connection, and three or more solder bumps from the second group of solder bumps are attached to the increased diameter pillars prior to connection. In one embodiment, the three or more solder bumps fuse with opposing solder bumps on corresponding contact pads during connection. In another embodiment, a combined pre-connection height of the three or more solder bumps and the opposing solder bumps is greater than a pre-connection height of solder bumps from the first group of solder bumps.

A system of the present invention is also presented to connect an integrated circuit device to a substrate. The system may be embodied by an integrated circuit device, a substrate, a plurality of standard diameter pillars, three or more increased diameter pillars, a first group of solder bumps, and a second group of solder bumps. In particular, the system, in one embodiment, includes an integrated circuit device and a substrate opposite the integrated circuit device. In one embodiment, the plurality of standard diameter pillars, the three or more increased diameter pillars, the first group of solder bumps, and the second group of solder bumps are substantially similar to those described above with regard to the apparatus.

A method of the present invention is also presented for connecting an integrated circuit device to a substrate. The method in the disclosed embodiments substantially includes the steps necessary to carry out the functions presented above with respect to the operation of the described apparatus and system.

In one embodiment, the method includes connecting a plurality of standard diameter electrically conductive pillars to an integrated circuit device. The method also may include connecting three or more increased diameter electrically conductive pillars to the integrated circuit device. In one embodiment, the increased diameter pillars have a height that is similar to a height of the standard diameter pillars. In a further embodiment, the increased diameter pillars have a diameter that is greater than a diameter of the standard diameter pillars. In another embodiment, the standard diameter pillars and the increased diameter pillars form a pattern on the integrated circuit device that corresponds to a plurality of electrically conductive contact pads disposed on a substrate opposite the integrated circuit device.

In a further embodiment, the method includes placing a first group of solder bumps between the standard diameter pillars and contact pads corresponding to the standard diameter pillars. The method, in another embodiment, includes placing a second group of solder bumps between the increased diameter pillars and contact pads corresponding to the increased diameter pillars. In one embodiment, solder bumps in the second group of solder bumps have a pre-connection height that is greater than a pre-connection height of the first group of solder bumps.

The method, in one embodiment, includes placing the integrated circuit device upon the substrate. The second group of solder bumps, in a further embodiment, comprises initial pre-connection contact points between the increased diameter pillars and the corresponding contact pads to support the integrated circuit device upon the substrate.

In another embodiment, the method includes melting the first and second groups of solder bumps. In one embodiment, the second group of solder bumps and the increased diameter pillars are sized such that, in response to the second group of solder bumps melting, a surface tension between the second group of solder bumps and the increased diameter pillars pulls the contact pads and the pillars into alignment to compensate for initial misalignment. In a further embodiment, the second group of solder bumps and the increased diameter pillars are sized such that, in response to the second group of solder bumps melting, a surface tension between the second group of solder bumps and the increased diameter pillars pulls the first group of solder bumps into contact with both the contact pads and the standard diameter pillars to compensate for warpage in the substrate. The solder bumps from the first and second groups of solder bumps, in one embodiment, are attached to at least one of a pillar and a contact pad prior to connection of the pillars and the contact pads.

Another apparatus to connect an integrated circuit device to a substrate is provided with a plurality of elements configured to functionally connect the integrated circuit device to the substrate. These elements in the described embodiments include a plurality of standard diameter copper pillars, four increased diameter copper pillars, a first group of solder bumps, and a second group of solder bumps.

In one embodiment, the standard diameter pillars and the increased diameter pillars are disposed on an integrated circuit device. The increased diameter pillars, in a further embodiment, have a height that is similar to a height of the standard diameter pillars. In another embodiment, the increased diameter pillars have a diameter that is greater than a diameter of the standard diameter pillars. In one embodiment, the standard diameter pillars and the increased diameter pillars form a pattern on the integrated circuit device with the increased diameter pillars disposed at a corner of the pattern. The pattern, in a further embodiment, corresponds to a plurality of electrically conductive contact pads disposed on an organic laminate substrate opposite the integrated circuit device.

In one embodiment, the first group of solder bumps is disposed between the standard diameter pillars and contact pads corresponding to the standard diameter pillars. The second group of solder bumps, in one embodiment, is disposed between the increased diameter pillars and contact pads corresponding to the increased diameter pillars. In a further embodiment, solder bumps in the second group of solder bumps have a pre-connection height that is greater than a pre-connection height of the first group of solder bumps. The second group of solder bumps, in one embodiment, comprises initial pre-connection contact points between the increased diameter pillars and the corresponding contact pads.

In a further embodiment, the second group of solder bumps and the increased diameter pillars are sized such that, in response to the second group of solder bumps melting, a surface tension between the second group of solder bumps and the increased diameter pillars pulls the contact pads and the pillars into alignment to compensate for initial misalignment of the integrated circuit device. In another embodiment, the second group of solder bumps and the increased diameter pillars are sized such that, in response to the second group of solder bumps melting, a surface tension between the second group of solder bumps and the increased diameter pillars pulls the first group of solder bumps into contact with both the contact pads and the standard diameter pillars to compensate for warpage in the organic laminate substrate.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention.

These features and advantages of the present invention will become more fully apparent from the following description and appended claims, or may be learned by the practice of the invention as set forth hereinafter.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION

As will be appreciated by one skilled in the art, aspects of the present invention may be embodied as an apparatus, system, or method. Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Furthermore, the described features, structures, or characteristics of the invention may be combined in any suitable manner in one or more embodiments. In the following description, numerous specific details are provided to give a thorough understanding of embodiments of the invention. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

Aspects of the present invention are described below with reference to schematic flowchart diagrams and/or schematic block diagrams of methods, apparatuses, and systems according to embodiments of the invention. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and computer instructions.

Figure 1:
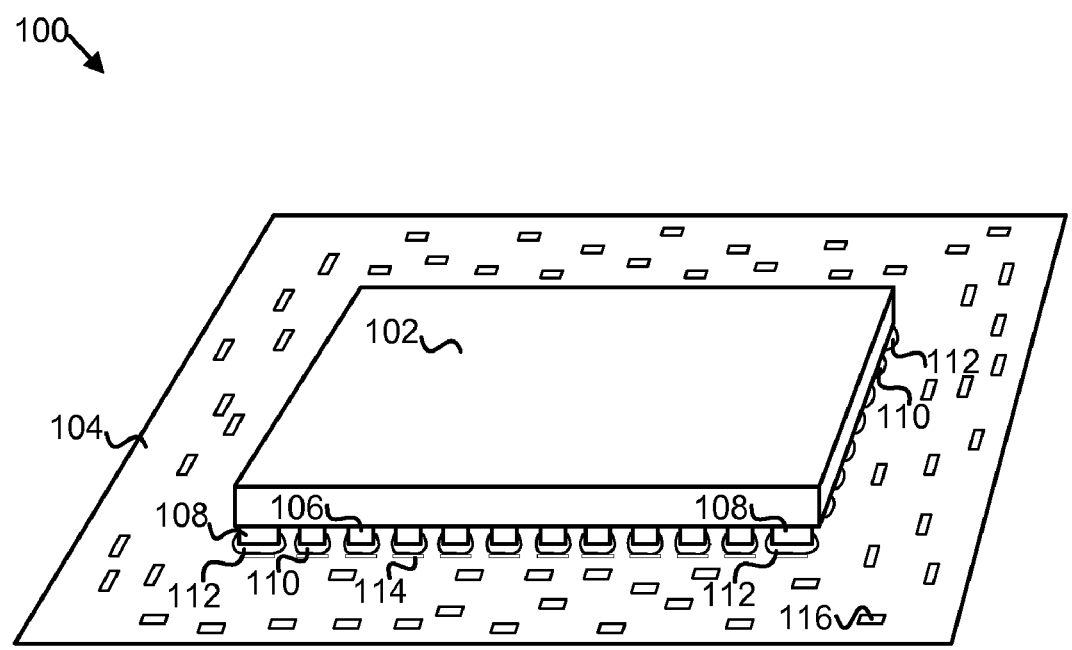
FIG. 1 is a schematic block diagram illustrating one embodiment of a system to connect an integrated circuit device to a substrate in accordance with the present invention.

FIG. 1 depicts a system 100 to connect an integrated circuit device 102 to a substrate 104. In the depicted embodiment, the integrated circuit device 102 includes a plurality of standard diameter pillars 106 and three or more increased diameter pillars 108. As depicted, the substrate 104 includes a plurality of contact pads 114 and one or more electronic elements 116. A first group of solder bumps 110 is disposed between the standard diameter pillars 106 and the contact pads 114, and a second group of solder bumps 112 is disposed between the increased diameter pillars 108 and the contact pads 114, electrically coupling the integrated circuit device 102 to the substrate 104.

By using the plurality of standard diameter pillars 106 and the three or more increased diameter pillars 108 to connect the integrated circuit device 102 to the substrate 104, the system 100 minimizes the amount of solder 110, 112 used in the connections and compensates for warpage in the substrate 104 and misalignment of the integrated circuit device 102. Warpage in a substrate 104 can manifest itself as waves, ripples, dips, bends, or other surface deformations in the substrate 104. Warpage can be caused by manufacturing defects, materials used for a substrate 104, age, humidity, temperature, or other factors. Warpage in a substrate 104 causes contact pads 114 on the substrate 104 to have slightly inconsistent heights.

As is described in greater detail below, the greater diameter of the increased diameter pillars 108 and the greater pre-connection height of the second group of solder bumps 112 creates a greater surface tension in the melted second group of solder bumps 112 during reflow soldering. This surface tension pulls the integrated circuit device 102 into alignment with the substrate 104 to compensate for initial misalignment and pulls the integrated circuit device 102 toward the substrate 104 to compensate for warpage in the substrate 104.

In the depicted embodiment, the integrated circuit device 102 is a flip-chip type integrated circuit device, with an array of electrical contacts distributed over an entire side of the die, rather than solely along a periphery. The integrated circuit device 102 may be an analog, digital, or mixed signal integrated circuit, such as a processor, controller, memory, sensor, amplifier, signal processor, signal converter, or other integrated circuit device. In the depicted embodiment, the array of electrical contacts on the integrated circuit device 102 includes the plurality of standard diameter pillars 106 and the three or more increased diameter pillars 108.

In one embodiment, the plurality of standard diameter pillars 106 and the three or more increased diameter pillars 108 are made of an electrically conductive material. Using an electrically conductive material for the pillars 106, 108 reduces the effects of electromigration in solder joints 110, 112, because materials, like copper, that may be used for the pillars 106, 108 typically have better electromigration performance than does solder.

In order to act as input/output contacts for the integrated circuit device 102, the plurality of standard diameter pillars 106 and the three or more increased diameter pillars 108 may be part of, connected to, or otherwise integrated with internal connections of the integrated circuit device 102. For example, a pillar 106, 108 may be plated onto a seed layer of a contact pad on the integrated circuit device 102 using a resist coat or other mask to define a pillar area on the contact pad, may be evaporated through a suitable mask, or may be otherwise connected to an electrical contact of the integrated circuit device 102. A process of plating the pillars 106, 108 onto an electrical contact may include several treatments. The plurality of standard diameter pillars 106 and the three or more increased diameter pillars 108 form an array of electrical contacts disposed on the integrated circuit device 102.

In one embodiment, the plurality of standard diameter pillars 106 and the three or more increased diameter pillars 108 are made of copper, such as pure copper, a copper alloy, plated copper, or the like. For example, in one embodiment, the pillars 106, 108 may include a copper nickel alloy, a copper silver alloy, or may be plated with nickel, cobalt, or the like. A layer of plating on the pillars 106, 108 typically acts as a barrier layer to decrease the inter-metallic formation that occurs in reaction with the solder 110, 112 that is used to connect the pillars 106, 108 to the contact pads 114. In other embodiments, the pillars 106, 108 may include another electrically conductive material.

In the depicted embodiment, the three or more increased diameter pillars 108 and the plurality of standard diameter pillars 106 each have a similar height. As depicted, the three or more increased diameter pillars 108 have a width or diameter that is greater than the width or diameter of the standard diameter pillars 106. As used herein, diameter refers not only to pillars 106, 108 of circular shape, but also to the width of pillars 106, 108 having other shapes.

The larger diameter and corresponding surface area of the increased diameter pillars 108 allows for a greater initial misalignment of the pillars 108, without missing corresponding contact pads 114 completely. Additionally, the larger diameter and corresponding surface area of the increased diameter pillars 108, together with a higher height of solder 112 between the increased diameter pillars 108 and the contact pads 114, creates a pulling force between the increased diameter pillars 108 and the contact pads 114 due to the surface tension of the melted solder 112. This force pulls the integrated circuit device 102 into better alignment with the substrate 104 and pulls the pillars 106, 108 toward the contact pads 114 with greater force to overcome warpage of the substrate 104.

The standard diameter pillars 106 and the three or more increased diameter pillars 108 are disposed on the integrated circuit device 102 in a pattern, such that the pillars 106, 108 correspond to the contact pads 114 on the substrate 104. In one embodiment, the increased diameter pillars 108 are disposed toward an edge of the pattern of pillars 106, 108. With the increased diameter pillars 108 toward an edge of the pattern, the increased diameter pillars 108 and corresponding solder bumps 112 may support the integrated circuit device 102 when placed on the substrate 104 prior to connection. In a further embodiment, the increased diameter pillars 108 are disposed at corners of the pattern of pillars 106, 108. For example, in one embodiment four increased diameter pillars 108 may be placed at corners of a square or rectangular pattern of pillars 106, 108. In one embodiment, there are more standard diameter pillars 106 than increased diameter pillars 108, such that the standard diameter pillars 106 form the majority of the pillars 106, 108.

In one embodiment, the substrate 104 is a chip carrier that provides electrical connections and structural support for the integrated circuit device 102. The substrate 104 may connect the integrated circuit device 102 to external circuitry. The substrate 104 may itself include external circuitry, may include connectors or contacts for connection with external circuitry, or both. For example, the substrate 104 may be a printed circuit board upon which the integrated circuit device 102 is directly mounted, or the substrate 104 may be a base portion of a flip-chip assembly that interfaces with additional circuitry or connectors, such as a land grid array socket, a pin grid array socket, a ball grid array, an edge connector socket, or the like. In one embodiment, the substrate 104 is made of a material, such as an organic laminate, that is subject to warping or other surface abnormalities. The substrate 104 may have multiple layers, such as electrically conductive layers, insulating layers, structural support layers, stiffening layers, heat dissipation layers, and the like.

In one embodiment, the plurality of contact pads 114 is disposed on the substrate 104 facing the integrated circuit device 102. The contact pads 114 provide a mounting surface for the integrated circuit device 102. The contact pads 114 further provide electrical contacts for the plurality of standard diameter pillars 106 and the three or more increased diameter pillars 108. The contact pads 114 may be made of an electrically conductive material, and may be metalized, plated, or the like to facilitate a solder connection between the contact pads 114 and the pillars 106, 108. The contact pads 114 are disposed in a pattern on the substrate 104, and the pillars 106, 108 are disposed in a similar pattern on the integrated circuit device 102. In one embodiment, each of the contact pads 114 are similar in shape and size, regardless of whether they correspond to a standard diameter pillar 106 or an increased diameter pillar 108. In an alternate embodiment, contact pads 114 that correspond to an increased diameter pillar 108 have a greater size and surface area than contact pads 114 that correspond to a standard diameter pillar 106.

The substrate 104, in a further embodiment, may include one or more electrical connections, such as traces, vias, pins, wires, connectors, or the like, that connect to the contact pads 114. For example, the substrate 104 may electrically connect the contact pads 114 with the one or more electronic elements 116, one or more additional contact pads, one or more electrical connectors, or the like. In one embodiment, the substrate 104 may include a plurality of additional electrical contacts to electrically interface with additional circuitry or connectors, such as a land grid array socket, a pin grid array socket, a ball grid array, an edge connector socket, or the like. For example, an array of additional electrical contacts that are in electrical communication with the contact pads 114 may be disposed on an opposite side of the substrate 104, along an edge of the substrate 104, or the like.

In the depicted embodiment, the first group of solder bumps 110 is disposed between the standard diameter pillars 106 and the contact pads 114. The first and second groups of solder bumps 110, 112 may include a lead-tin solder such as a eutectic or other lead-tin solder, a lead-free solder, or other type of solder capable of providing an electrical and structural connection between the pillars 106, 108 and the contact pads 114. In a further embodiment, the type of solder selected for use in the first group of solder bumps 110 may be different than the type of solder selected for use in the second group of solder bumps 112.

Solder bumps from the first group of solder bumps 110 may, prior to connection/reflow soldering, be initially disposed on the standard diameter pillars 106, the contact pads 114, or both. In response to melting during reflow soldering, the first group of solder bumps 110 connect the standard diameter pillars 106 both electrically and structurally to the contact pads 114 that correspond to the standard diameter pillars 106.

In the depicted embodiment, the second group of solder bumps 112 is disposed between the increased diameter pillars 108 and the contact pads 114. In one embodiment, solder bumps from the second group of solder bumps 112 have a pre-connection height that is greater than a pre-connection height of solder bumps from the first group of solder bumps 110. The pre-connection height is the height of the solder prior to reflow soldering, the melting of the solder bumps 110, 112 to connect the contact pads 114 with the pillars 106, 108.

Solder bumps from the second group of solder bumps 112 may, prior to connection/reflow soldering, be initially disposed on the increased diameter pillars 108, the contact pads 114, or both. The second group of solder bumps 112, in addition to having a greater pre-connection height than the first group of solder bumps 110, may also have an increased diameter, similar to the diameter of the increased diameter pillars 108, to facilitate pre-connection attachment to the increased diameter pillars 108.

In response to melting during reflow soldering, the second group of solder bumps 112 each connect the increased diameter pillars 108 both electrically and structurally to the contact pads 114 corresponding to the increased diameter pillars 108. The melted second group of solder bumps 112 pulls the increased diameter pillars 108 toward the corresponding contact pads 114 to improve alignment of the integrated circuit device 102 and pull the standard diameter pillars 106 toward the corresponding contact pads 114 with enough force to overcome warpage in the substrate 104. Increasing the pre-connection height of the second group of solder bumps 112 allows the pre-connection height of the first group of solder bumps 110 to be minimized, preserving the electromigration benefits of the pillars 106, 108.

Figure 2:
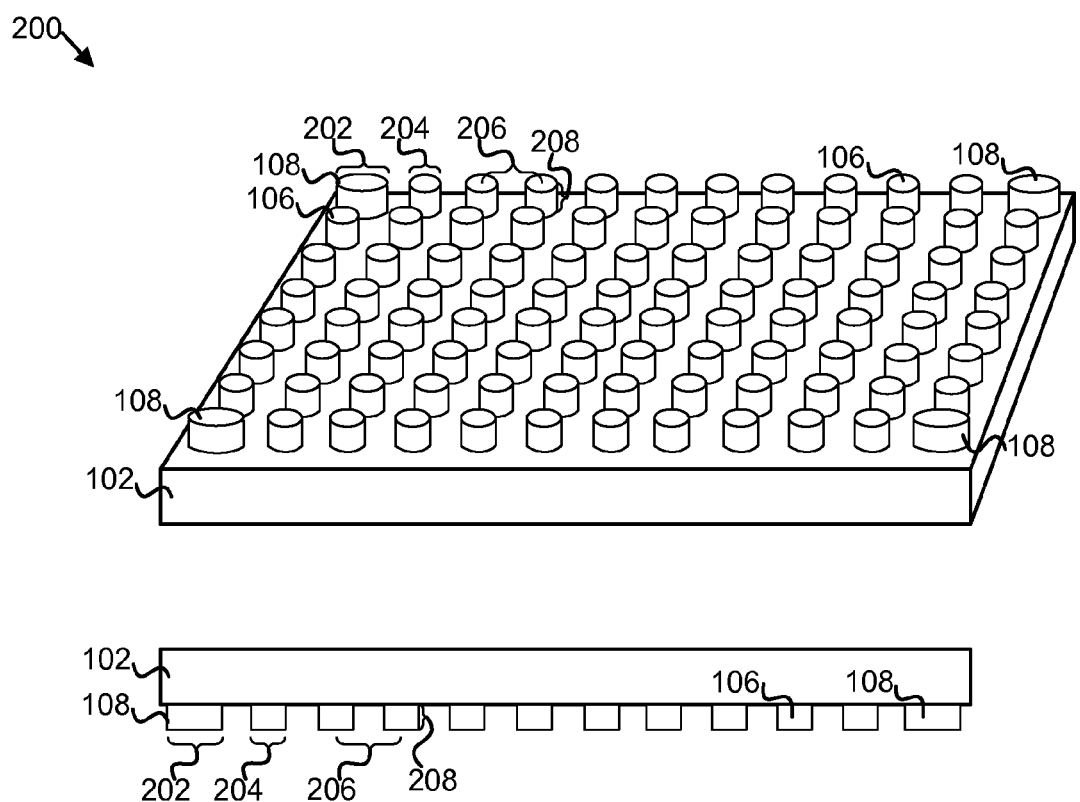
FIG. 2 is a schematic block diagram illustrating one embodiment of an integrated circuit device in accordance with the present invention.

FIG. 2 depicts another embodiment 200 of the integrated circuit device 102. In the depicted embodiment 200, the pillars 106, 108 are arranged in a rectangular pattern with each of the increased diameter pillars 108 at a corner of the pattern of pillars 106, 108 on the integrated circuit device 102. Two views are provided in FIG. 2, a flipped view of the integrated circuit device 102, displaying the pillars 106, 108 from above, and a side view of the integrated circuit device 102.

In the depicted embodiment 200, the increased diameter pillars 108 each have an increased diameter 202, and the standard diameter pillars 106 each have a standard diameter 204. The increased diameter 202 is greater than the standard diameter 204. In one embodiment, the increased diameter 202 is about 20-50% greater than the standard diameter 204. For example, in an embodiment where increased diameter pillars 108 have an increased diameter 202 of 90 um, the standard diameter pillars 106 may have a standard diameter 204 of about between 60 and 75 um. The increased diameter 202 and the standard diameter 204 may be selected based on a desired pitch 206 between pillars 106, 108, a desired pillar density, a desired total number of pillars, characteristics of the integrated circuit device 102, or the like.

In a further embodiment, the standard diameter pillars 106 and the increased diameter pillars 108 may not have consistently sized diameters 202, 204. For example, the integrated circuit device 102 may include several different sizes of increased diameter pillars 108, each with a diameter 202 that is generally larger than a diameter 204 of the standard diameter pillars 106. Similarly, the integrated circuit device 102 may include several different sizes of standard diameter pillars 106.

In the depicted embodiment 200, the pitch 206 is typically measured from the center of a pillar 106, 108 to the center of an adjacent pillar 106, 108. The pitch 206, in one embodiment, is between about 100-200 um. In one embodiment, the pitch 206 is about 150 um. In a further embodiment, the pitch 206 may be reduced below 100 um. In one embodiment, the pitch 206 is consistent between both standard diameter pillars 106 and between a standard diameter pillar 106 and an increased diameter pillar 108. In a further embodiment, the pitch 206 is larger between a standard diameter pillar 106 and an increased diameter pillar 108 due to the increased diameter 202 of the increased diameter pillars 108.

In the depicted embodiment 200, both the standard diameter pillars 106 and the increased diameter pillars 108 have a similar height 208. In one embodiment, the height 208 is between about 20-80 um. In a further embodiment, the height 208 is between about 40-60 um. The use of pillars 106, 108 as electrical connectors for the integrated circuit device 102 allows the pitch 206 of the pillars 106, 108 to be reduced to allow for higher connection densities without significantly reducing the height 208 of the pillars 106, 108. This is because the pillars 106, 108 do not melt during reflow soldering, as traditional solder connections do, allowing for greater standoff heights at higher densities than can be achieved with traditional solder connections.

Figure 3:
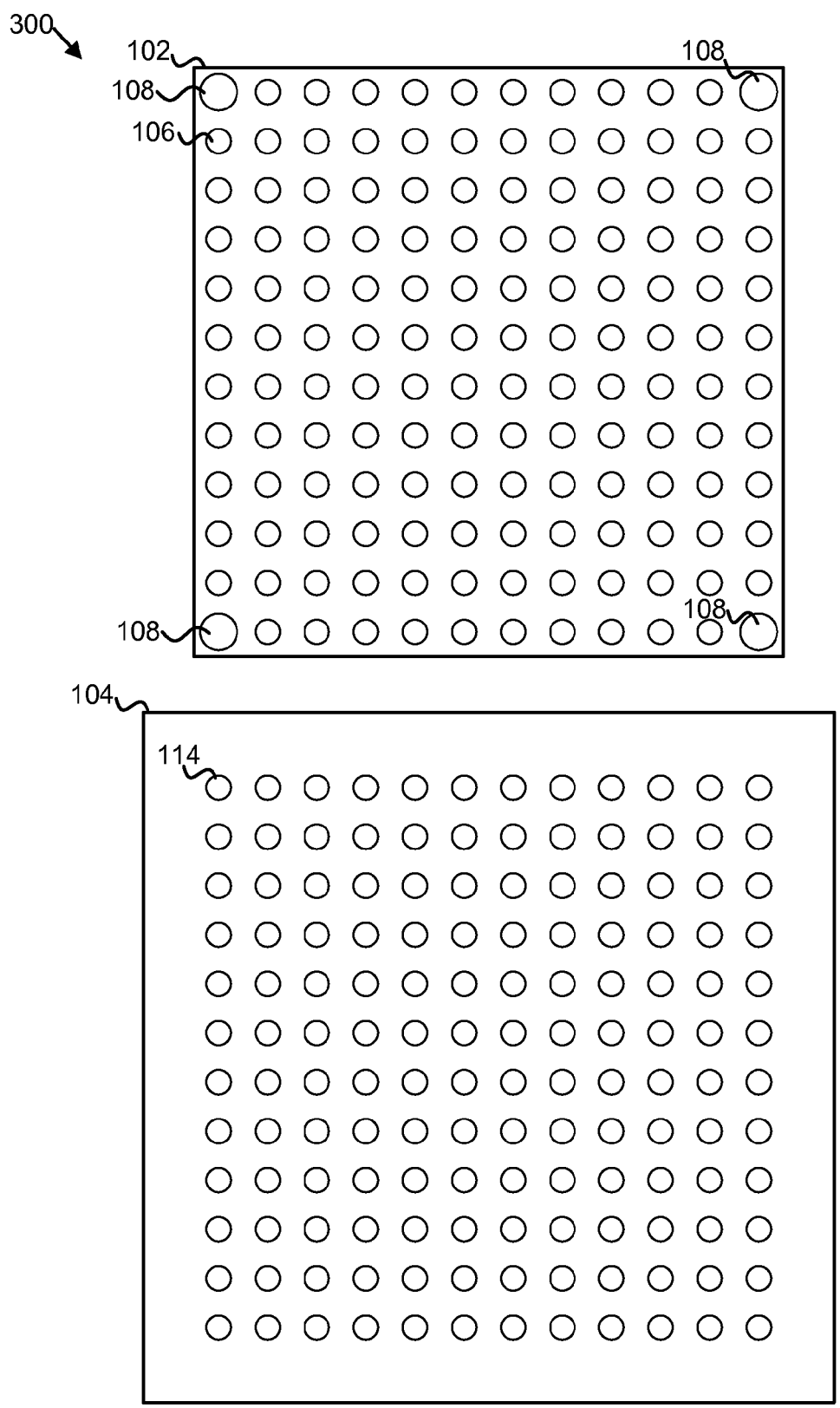
FIG. 3 is a schematic block diagram illustrating one embodiment of an integrated circuit device and a substrate in accordance with the present invention.

FIG. 3 depicts another embodiment 300 of the integrated circuit device 102 and the substrate 104. In the depicted embodiment 300, the increased diameter pillars 108 and the standard diameter pillars 106 are disposed on the integrated circuit device 102 in a square pattern. The increased diameter pillars 108 are at corners of the pattern of pillars 106, 108. The plurality of contact pads 114 are similarly arranged in a square pattern corresponding to the pattern of pillars 106, 108. In the depicted embodiment 300, the pillars 106, 108 are arranged in a twelve by twelve array for purposes of illustration, in another embodiment, the integrated circuit device 102 may include hundreds or thousands of pillars 106, 108 arranged in more complex or larger patterns based on the design and input/output requirements of the integrated circuit device 102.

In the depicted embodiment 300, each of the contact pads 114 has a standard size, regardless of the positions of the increased diameter pillars 108. This simplifies manufacture, allows existing substrates 104 to be used with the present invention, and allows the majority of the solder in the second group of solder bumps 112 to spread along the increased diameter pillars 108 to maximize the pulling force. In a further embodiment, contact pads 114 corresponding to the increased diameter pillars 108 may be larger than contact pads 114 corresponding to the standard diameter pillars 106.

Additionally, while the pillars 106, 108 and the contact pads 114 are illustrated as circular, other shapes may be used.

For example, in another embodiment, both the pillars 106, 108 and the contact pads 114 may be square, or other combinations of circles, squares, rectangles, ovals, triangles, octagons, and the like may be used for the pillars 106, 108 and the contact pads 114.

Figure 4:
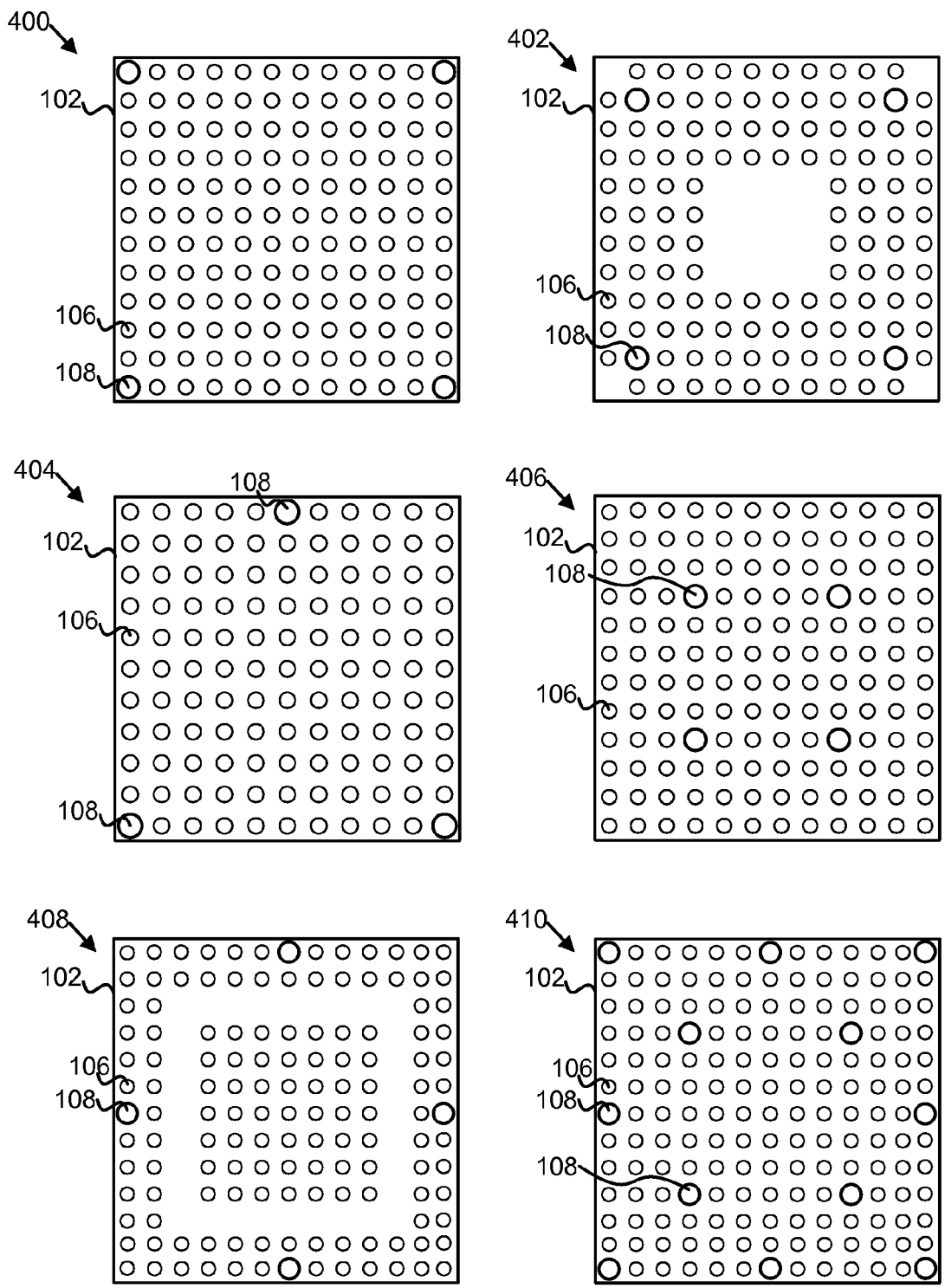
FIG. 4 is a schematic block diagram illustrating other embodiments of an integrated circuit device in accordance with the present invention.

FIG. 4 depicts other embodiments of the integrated circuit device 102 with various patterns 400, 402, 404, 406, 408, 410 of pillars 106, 108. While many other patterns may be used according to the present invention, the patterns 400, 402, 404, 406, 408, 410 are examples of positions for the three or more increased diameter pillars 108 that provide stable support to the integrated circuit device 102 on the substrate 104 prior to connection during reflow soldering. Each of the patterns 400, 402, 404, 406, 408, 410 typically corresponds to similar patterns of contact pads 114 on corresponding substrates 104 (not shown).

While typically a substrate 104 has a contact pad 114 corresponding to each pillar 106, 108, a substrate 104 may also have extraneous contact pads 114. For example, a substrate 104 may have contact pads 114 for compatibility for several types of integrated circuit devices 102, with different patterns of pillars 106, 108. A generic substrate 104 may have a generic array of contact pads 114 for use with many different patterns of pillars 106, 108. A new design of an integrated circuit device 102 may eliminate certain pillars 106, 108, but may be used with a substrate 104 that still has contact pads 114 corresponding to the eliminated pillars 106, 108.

In each of the patterns 400, 402, 404, 406, 408, 410, the increased diameter pillars 108 are placed toward an edge, away from the center, of the pattern of pillars 106, 108 on the integrated circuit device 102. In the first pattern 400, the increased diameter pillars 108 are at the corners of the pattern of pillars 106, 108. In the second pattern 402, the pattern of pillars 106, 108 does not have pillars directly at the corners of the integrated circuit device 102, and the increased diameter pillars 108 are placed on a row that is inward from the edge of the pattern of pillars 106, 108, toward the corners of the pattern. Both the first pattern 400 and the second pattern 402 have four increased diameter pillars 108 for stable placement of the integrated circuit device 102, with the increased diameter pillars 108 in a square pattern.

Placing the increased diameter pillars 108 at or toward corners of the pattern of pillars 106, 108 on the integrated circuit device 102 may have additional potential benefits. An electrical connections made toward a corner of a device, in certain embodiments, is more likely to fail due to thermal-fatigue, because it has a larger distance to neutral point ("DNP") than other connections. Electrical connections toward corners may also be more likely to experience physical forces that can damage the connections. Placing the increased diameter pillars 108 in corners may improve the reliability of the corner connections due to the increased diameters of the pillars 108 and the increased amount of solder in the second group of solder bumps 112. The increased diameter pillars 108 may also protect standard diameter pillars 106 that are located around the increased diameter pillars 108, improving the reliability of their connections.

In the third pattern 404, the increased diameter pillars 108 are placed in a triangular configuration within the third pattern 404. There are two increased diameter pillars 108 toward corners of the third pattern 404, and a third increased diameter pillar 108 along a center of an edge of the third pattern 404 opposite the other two increased diameter pillars 108.

A triangular configuration also provides stable placement of the integrated circuit device 102 on a substrate 104 prior to reflow soldering. A triangular configuration may provide slightly less pulling force due to less surface tension between the increased diameter pillars 108 and the second group of solder bumps 112 than does a square configuration with four increased diameter pillars 108, because of the one fewer pillar in a triangular configuration, depending on the diameters used. In another embodiment, either one or two increased diameter pillars 108 may be used. A configuration with only one or two increased diameter pillars 108 may not provide as much stability as a square or triangular configuration, but may be useful in certain designs of the integrated circuit device 102.

The fourth pattern 406 has a square configuration of increased diameter pillars 108, with the increased diameter pillars 108 moved inward within the fourth pattern 406. The square configuration of increased diameter pillars 108 in the fourth pattern 406 provides stable placement of the integrated circuit device 102 on a substrate 104 prior to reflow soldering, and provides a substantially equal pulling force due to surface tension as does the first pattern 400. The fourth pattern 406, however, may provide slightly less rotational force to rectify misalignment, because the increased diameter pillars 108 have less torque when placed further within the fourth pattern 406 than do the increased diameter pillars 108 at the corner of the first pattern 400.

The fifth pattern 408 has four increased diameter pillars 108 that are each centered along an edge of the fifth pattern 408. The fifth pattern 408 and the second pattern 402 do not have uniform pillar placement throughout the patterns 402, 408. The placement of pillars 106, 108 may be determined based on design considerations related to the integrated circuit device 102, and, in certain embodiments, may not be uniform or symmetrical.

In the sixth pattern 410, the increased diameter pillars 108 are distributed throughout the sixth pattern 410. The configuration of increased diameter pillars 108 in the sixth pattern 410 uses more increased diameter pillars 108 and more solder than other patterns, but may also provide more pulling force to overcome severe warpage of the substrate 104, or the like.

Figure 5:
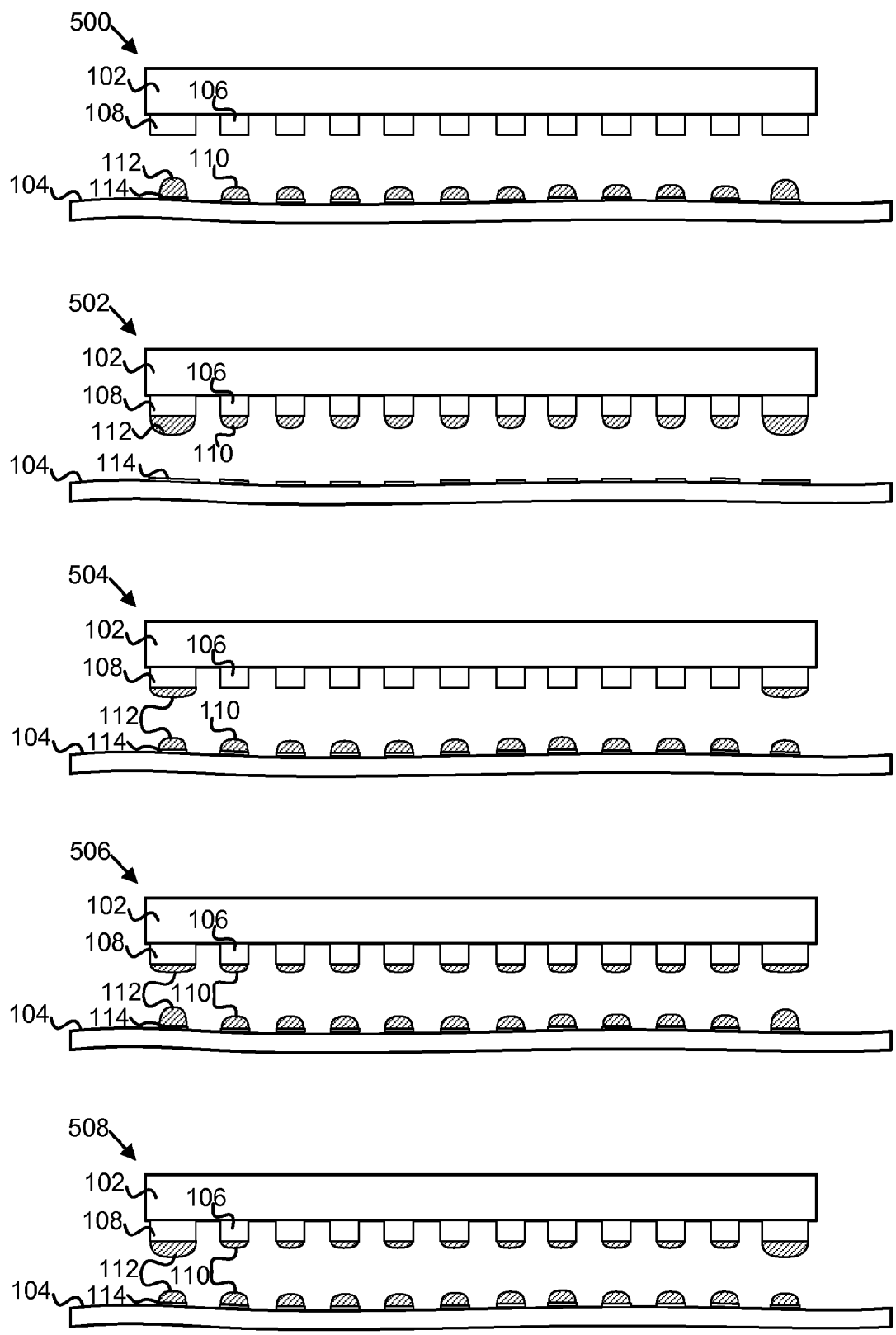
FIG. 5 is a schematic block diagram illustrating embodiments of an integrated circuit device and a warped substrate in accordance with the present invention.

FIG. 5 depicts additional embodiments 500, 502, 504, 506, 508 of the integrated circuit device 102 and the substrate 104. The embodiments 500, 502, 504, 506, 508 depict placement options of the first and second groups of solder bumps 110, 112 prior to connection of the integrated circuit device 102 and the substrate 104 during reflow soldering. In the depicted embodiments 500, 502, 504, 506, 508, the substrate 104 has some warpage, illustrating the variation in heights between the contact pads 114 due to the warpage.

In the depicted embodiments 500, 502, 504, 506, 508, the second group of solder bumps 112 has a greater height than the first group of solder bumps 110. As can be seen in the embodiments 500, 502, 504, 506, 508, when the integrated circuit device 102 is placed on the substrate 104, the second group of solder bumps 112 are the initial contact points between the integrated circuit device 102 and the substrate 104. The second group of solder bumps 112 supports the integrated circuit device 102 on the substrate 104 due to the greater height of the second group of solder bumps 112. This allows the amount of solder used for the first group of solder bumps 110 to be minimized, which in turn minimizes the effects of electromigration. For example, in one embodiment, the height of the first group of solder bumps 110 may be between about 20-30 um and the height of the second group of solder bumps 112 may be about 40-50 um, to overcome about 10-30 um of warpage in the substrate 104.

The taller second group of solder bumps 112 and the increased surface area of the increased diameter pillars 108 provide a greater pulling force between the integrated circuit device 102 and the substrate 104 due to the surface tension of the melted second group of solder bumps 112 and due to gravity. This greater pulling force pulls the standard diameter pillars 106 toward the corresponding contact pads 114 with enough force to overcome warpage or other variations in the substrate 104 so that each connection between the pillars 106, 108 and the contact pads 114 is wetted and completed. The surface tension of the melted second group of solder bumps 112 further pulls the integrated circuit device 102 and the substrate 104 into alignment by pulling the increased diameter pillars 108 into alignment with the corresponding contact pads 114.

Additionally, each of the solder bumps 110, 112 in the depicted embodiments 500, 502, 504 are illustrated as having a rounded cross-section. In a further embodiment, the solder bumps 110, 112 may have a different cross-section than that depicted. The shape of the solder bumps 110, 112 may be selected based on design considerations, manufacturing constraints, the method used to attach the solder bumps 110, 112, and the like.

In the first embodiment 500, the first group of solder bumps 110 and the second group of solder bumps 112 are connected to the contact pads 114 on the substrate 104 prior to connection of the pillars 106, 108 to the contact pads 114 during reflow soldering. This may be referred to as a solder-on-pad ("SOP") finish on the contact pads 114. In the first embodiment 500, the solder bumps 110, 112 may be plated onto the contact pads 114, printed onto the contact pads 114 using stencil printing, soldered in place, or otherwise placed on the contact pads 114.

In one embodiment, the substrate 104 may be manufactured with a uniform amount of solder on each of the contact pads 114, and additional solder may be added to the contact pads 114 corresponding to the increased diameter pillars 108 to form the second group of solder bumps 112. The additional solder causes the second group of solder bumps 112 to have a greater height than the first group of solder bumps 110 that correspond to the standard diameter pillars 106.

In the second embodiment 502, the first group of solder bumps 110 are connected to the standard diameter pillars 106 and the second group of solder bumps 112 are connected to the increased diameter pillars 108 prior to connection of the pillars 106, 108 to the contact pads 114 during reflow soldering. In the second embodiment 502, the solder bumps 110, 112 may be plated onto the pillars 106, 108, printed onto the pillars 106, 108 using stencil printing, soldered in place, or otherwise placed on the pillars 106, 108.

As depicted in the second embodiment 502 and in the third embodiment 504, the second group of solder bumps 112 has a greater diameter than the first group of solder bumps 110. This may simplify attachment of the second group of solder bumps 112 to the increased diameter pillars 108 by plating or the like. In a further embodiment, the first group of solder bumps 110 and the second group of solder bumps 112 each have substantially similar diameters.

In the second embodiment 502, the contact pads 114 corresponding to the increased diameter pillars 108 are depicted as having a greater size than the contact pads 114 corresponding to the standard diameter pillars 106. Increasing the size of contact pads 114 corresponding to the increased diameter pillars 108 may facilitate an increased surface tension in the second group of solder bumps 112 during reflow soldering. Increasing the size of contact pads 114 may accommodate an increased volume of solder in the second group of solder bumps 112 in an embodiment where the solder bumps 112 each have a diameter similar to that of the increased diameter pillars 108. The increased diameters of the second group of solder bumps 112 and the corresponding contact pads 114, in one embodiment, may overcome warpage in the substrate 104, but may not overcome as much misalignment as the first embodiment 500 overcomes.

As described above, the second group of solder bumps 112 that is connected to the increased diameter pillars 108 in the second embodiment 502 has a greater height than the first group of solder bumps 110 that is attached to the standard diameter pillars 106. The contact pads 114, in the second embodiment 502, may have a solderless finish such as organic surface protectant ("OSP"), gold, silver, nickel, nickel-gold, tin, or the like, or may have a uniform SOP finish much like the contact pads 114 in the third embodiment 504.

In the third embodiment 504, the first group of solder bumps 110 is connected to the contact pads 114 on the substrate 104. The second group of solder bumps 112, however, is split between the increased diameter pillars 108 and the corresponding contact pads 114. In the third embodiment 504, there is a uniform amount of solder on each contact pad 114. In a further embodiment, the substrate 104 may be manufactured with this uniform SOP finish. Additional solder is attached to the increased diameter pillars 108.

Together the solder on the increased diameter pillars 108 and on the corresponding contact pads 114 form the second group of solder bumps 112. The combined height of the solder on the increased diameter pillars 108 and the solder on the corresponding contact pads 114 (collectively the second group of solder bumps 112) is greater than the height of solder bumps in the first group of solder bumps 110, which are attached to the contact pads 114 corresponding to the standard diameter pillars 106. The third embodiment 504 allows the present invention to be used with standard height SOP finished contact pads 114.

The fourth embodiment 506 is similar to the first embodiment 500, and further includes a uniform amount of solder 112, 110 on each of the pillars 106, 108. In the fourth embodiment 506, the first group of solder bumps 110 is distributed on both the contact pads 114 and the standard diameter pillars 106, and the second group of solder bumps 112 is distributed on both the contact pads 114 and the increased diameter pillars 108. As depicted, the combined pre-connection heights of opposing members of the second group of solder bumps 112 are greater than the combined pre-connection heights of opposing members of the first group of solder bumps 110. In this embodiment 506, the integrated circuit device 102 may be manufactured with a standard height SOP finish on the pillars 106, 108, or the like.

The fifth embodiment 508 is similar to the third embodiment 504, and further includes a uniform amount of solder 110 on each of the standard diameter pillars 106. The solder 112 on the increased diameter pillars 108 has a greater height than does the solder 110 on the standard diameter pillars 106. The solder 110, 112 on the contact pads 114 has a uniform height. As depicted, the combined pre-connection heights of opposing members of the second group of solder bumps 112 is greater than the combined pre-connection heights of opposing members of the first group of solder bumps 110.

The depicted embodiments 500, 502, 504, 506, 508 illustrate that the first and second groups of solder bumps 110, 112 may be initially disposed on various combinations of the pillars 106, 108 and/or the contact pads 114 prior to connection during reflow soldering. In each depicted embodiment 500, 502, 504, 506, 508, there is a greater height of solder 112 between the increased diameter pillars 108 and corresponding contact pads 114 than there is between the standard diameter pillars 106 and corresponding contact pads 114.

Figure 6:
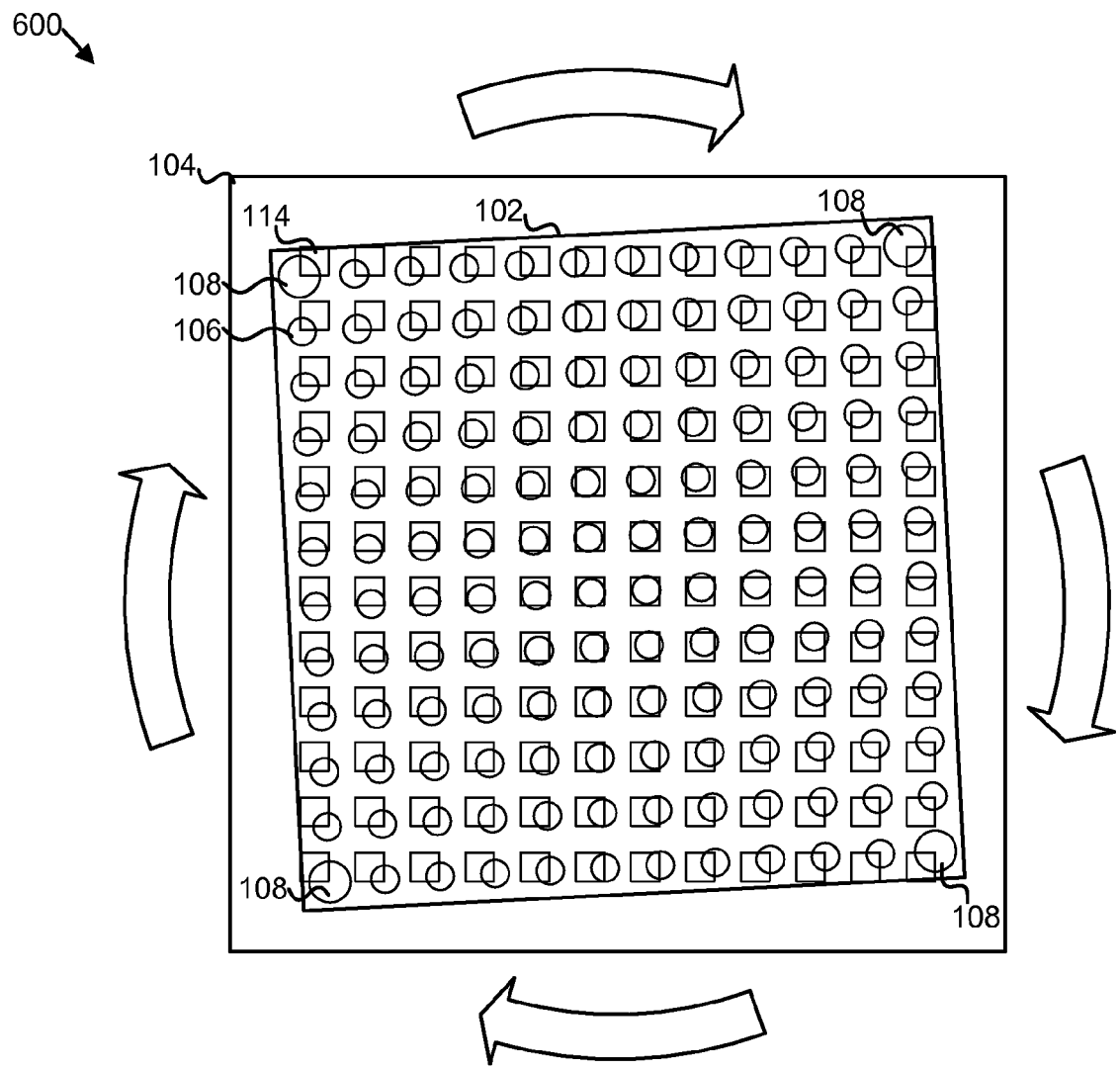
FIG. 6 is a schematic block diagram illustrating one embodiment of a misaligned integrated circuit device and substrate in accordance with the present invention.

FIG. 6 depicts an embodiment 600 of the integrated circuit device 102 that is misaligned with the substrate 104 prior to connection during reflow soldering. In the depicted embodiment 600, the pillars 106, 108 are not properly aligned with the contact pads 114, and are rotated somewhat in the counterclockwise direction. In the depicted embodiment 600, the increased diameter pillars 108 and the corresponding contact pads 114 do have some amount of overlapping surface area. The contact pads 114, as depicted, are square shaped for purposes of illustration, to differentiate the contact pads 114 from the circular pillars 106, 108. In another embodiment, the contact pads 114 may be circular or may have another shape.

During reflow soldering, the first and second groups of solder bumps 110, 112 melt. A surface tension of the melted second group of solder bumps 112 pulls the increased diameter pillars 108 toward the corresponding contact pads 114. In the depicted embodiment 600, the surface tension rotates the integrated circuit device 102 in the clockwise direction to align the pillars 106, 108 more closely with the contact pads 114. The present invention compensates for a greater amount of misalignment than is possible using only standard diameter pillars 106, because there is overlapping surface area between the increased diameter pillars 108 and the contact pads 114 under greater misalignment, due to the increased size of the increased diameter pillars 108.

Figure 7:
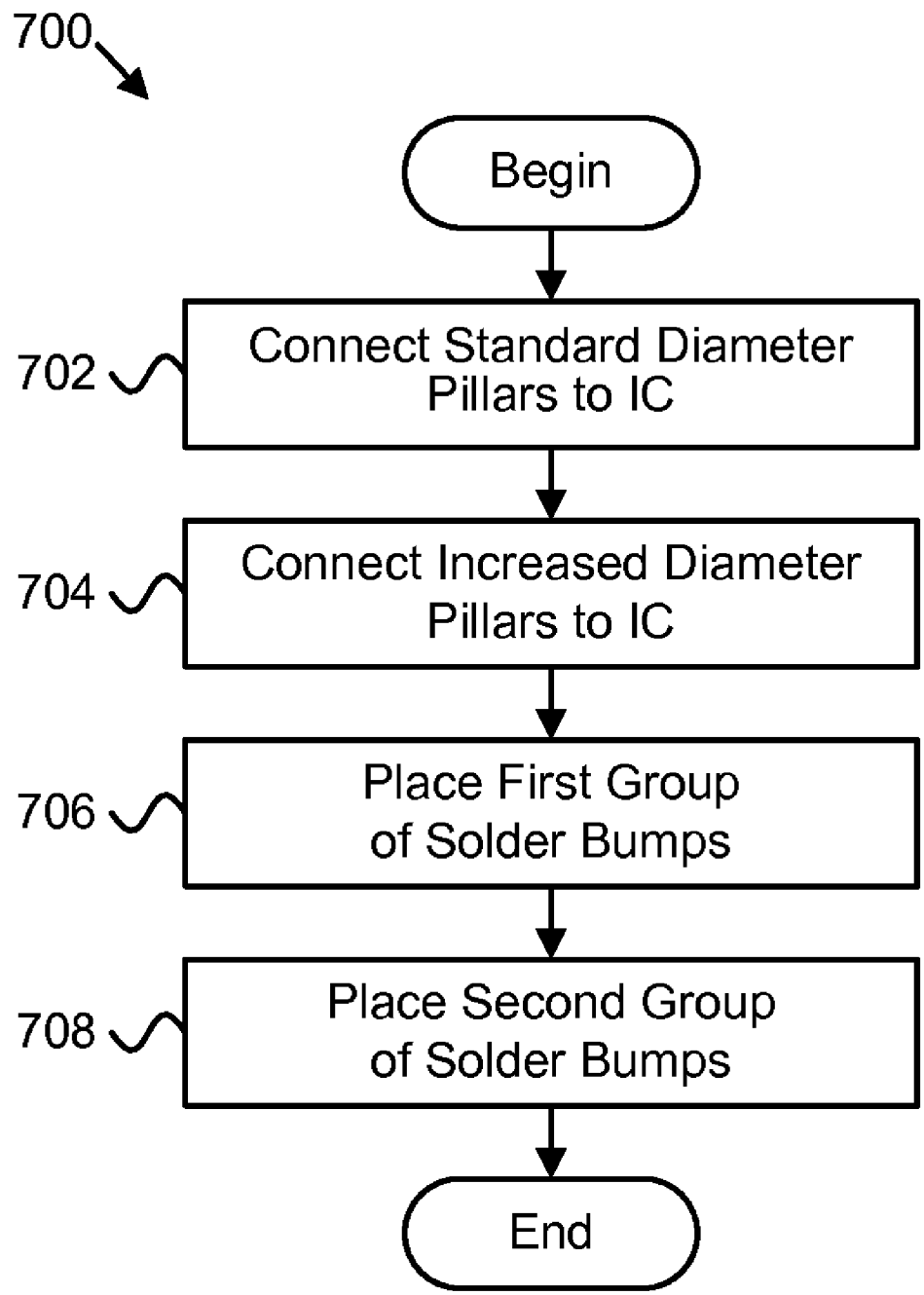
FIG. 7 is a schematic flow chart diagram illustrating one embodiment of a method for connecting an integrated circuit device to a substrate in accordance with the present invention.

FIG. 7 depicts one embodiment of a method 700 for connecting the integrated circuit device 102 to the substrate 104. The method 700 begins and a device assembler connects 702 the standard diameter pillars 106 to the integrated circuit device 102. The device assembler may be one or more automated assembly devices, assembly workers, assembly tools, or the like.

The device assembler connects 704 the increased diameter pillars 108 to the integrated circuit device 102. The device assembler may connect 702, 704 the standard diameter pillars 106 and the increased diameter pillars 108 to the integrated circuit device 102 simultaneously, for example during a single plating process, or may connect 702, 704 the standard diameter pillars 106 and the increased diameter pillars 108 independently of each other.

The device assembler places 706 the first group of solder bumps 110 on the standard diameter pillars 106, on the contact pads 114 corresponding to the standard diameter pillars 106, or on both. The device assembler places 708 the second group of solder bumps 112 on the increased diameter pillars 108, on the contact pads 114 corresponding to the increased diameter pillars 108, or on both, and the method 700 ends.

The device assembler may place 706, 708 the first group of solder bumps 110 and the second group of solder bumps 112 either simultaneously, for example during a single plating process, or independently. In a further embodiment, at least a subset of solder bumps from the first and second group of solder bumps 110, 112 may be pre-attached to the pillars 106, 108 and/or the contact pads 114, and the placing steps 706, 708 may include adding additional solder, such as increasing the height of the second group of solder bumps 112 or the like.

Figure 8:
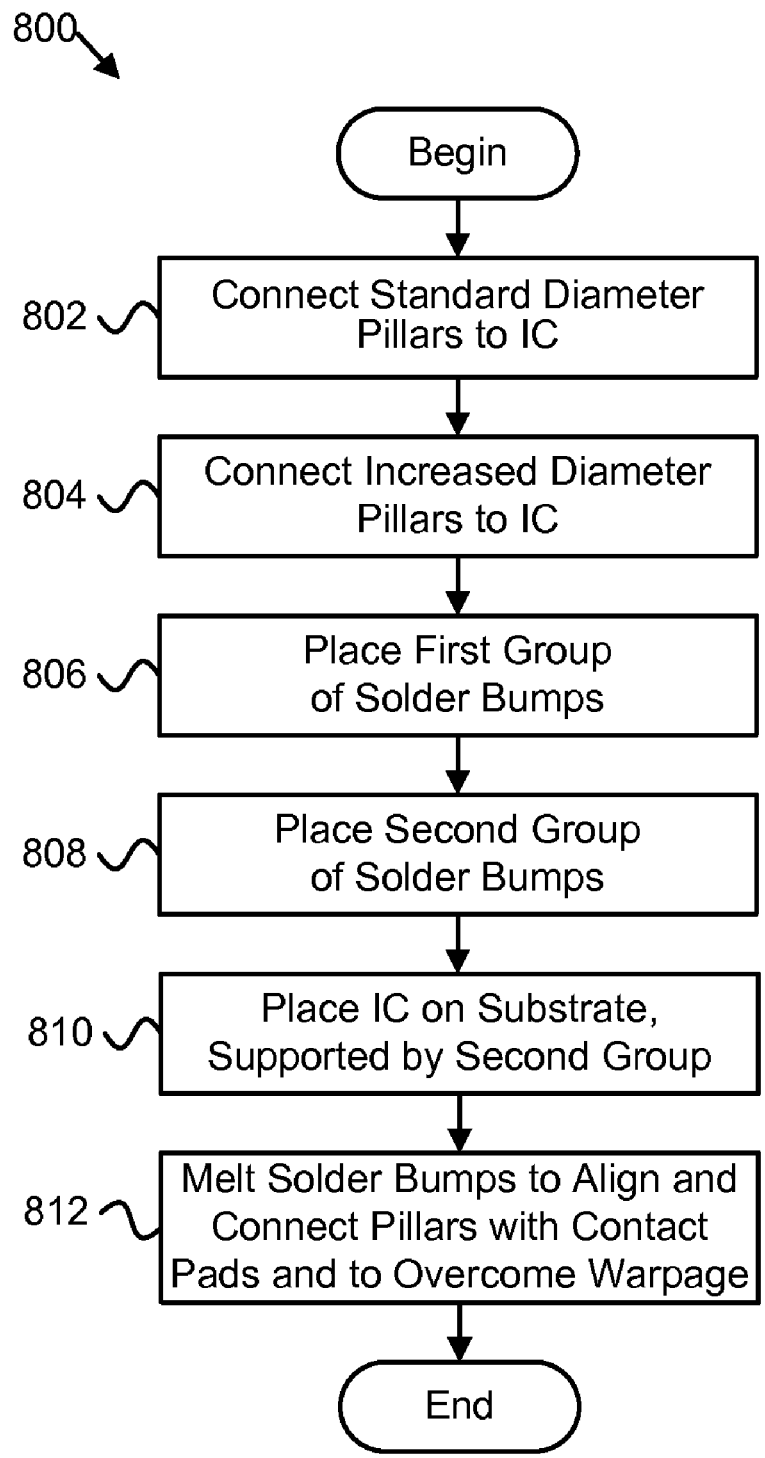
FIG. 8 is a schematic flow chart diagram illustrating another embodiment of a method for connecting an integrated circuit device to a substrate in accordance with the present invention.

FIG. 8 depicts another embodiment of a method 800 for connecting the integrated circuit device 102 to the substrate 104. The method 800 begins and the device assembler connects 802 the standard diameter pillars 106 to the integrated circuit device 102. The device assembler connects 804 the increased diameter pillars 108 to the integrated circuit device 102. The device assembler may connect 802, 804 the standard diameter pillars 106 and the increased diameter pillars 108 to the integrated circuit device 102 simultaneously or may connect 802, 804 the standard diameter pillars 106 and the increased diameter pillars 108 independently of each other.

The device assembler places 806 the first group of solder bumps 110 on the standard diameter pillars 106, on the contact pads 114 corresponding to the standard diameter pillars 106, or on both. The device assembler places 808 the second group of solder bumps 112 on the increased diameter pillars 108, on the contact pads 114 corresponding to the increased diameter pillars 108, or on both.

The device assembler may place 806, 808 the first group of solder bumps 110 and the second group of solder bumps 112 either simultaneously or independently. In a further embodiment, at least a subset of solder bumps from the first and second group of solder bumps 110, 112 may be pre-attached to the pillars 106, 108 and/or the contact pads 114, and the placing steps 806, 808 may include adding additional solder, such as increasing the height of the second group of solder bumps 112 or the like.

The device assembler places 810 the integrated circuit device 102 on the substrate 104. The solder bumps from the second group of solder bumps 112, with their greater heights, are the initial contact points, supporting the integrated circuit device 102 as it is placed 810 onto the substrate 104. The placement 810 of the integrated circuit device 102 on the substrate 104 may be misaligned such that the pillars 106, 108 and the contact pads 114 are rotated or displaced with regard to each other.

The device assembler melts 812 the first and second groups of solder bumps 110, 112, and the method 800 ends. As the second group of solder bumps 112 melt 812, the surface tension of the melted solder bumps 112 spreads along the surface area of the increased diameter pillars 108, pulling the integrated circuit device 102 toward the substrate 104 and into alignment with the substrate 104. The pulling force pulls the standard diameter pillars 106 toward the corresponding contact pads 114 such that both the standard diameter pillars 106 and the corresponding contact pads 114 contact the melted 812 first group of solder bumps 110. This wets the solder to both the standard diameter pillars 106 and the corresponding contact pads 114 and creates an electrical and structural connection between them.

The device assembler may melt 812 the first and second groups of solder bumps 110, 112 in a furnace, such as a belt furnace, a vacuum furnace, a box furnace, or the like, using conduction, convection, infrared, or other heating. In a further embodiment, the connected integrated circuit device 102 and substrate 104 may undergo further processing, such as quality checks for non-wet connections, flux cleaning, under-filling, connection to additional devices and/or components, and the like.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "includes," "has," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. An apparatus to connect an integrated circuit device to a substrate, the apparatus comprising:
   a plurality of standard diameter electrically conductive pillars disposed on an integrated circuit device;
   three or more increased diameter electrically conductive pillars disposed on the integrated circuit device, the increased diameter pillars having a height that is similar to a height of the standard diameter pillars, the increased diameter pillars having a diameter that is greater than a diameter of the standard diameter pillars, the standard diameter pillars and the increased diameter pillars forming a pattern on the integrated circuit device, the pattern corresponding to a plurality of electrically conductive contact pads disposed on a substrate opposite the integrated circuit device, the heights of the increased diameter pillars and the standard diameter pillars disposed on the integrated circuit device being greater than a height of the contact pads disposed on the substrate;
   a first group of solder bumps disposed between the standard diameter pillars and contact pads corresponding to the standard diameter pillars; and
   a second group of solder bumps disposed between the increased diameter pillars and contact pads corresponding to the increased diameter pillars, solder bumps in the second group of solder bumps having a pre-connection height that is greater than a pre-connection height of the first group of solder bumps, the greater pre-connection height of the second group of solder bumps pulling the first group of solder bumps into contact with both the contact pads and the standard diameter pillars in response to at least the second group of solder bumps melting.

2. The apparatus of claim 1, wherein the second group of solder bumps comprises initial pre-connection contact points between the increased diameter pillars and the corresponding contact pads due to the greater pre-connection height of the second group of solder bumps.

3. The apparatus of claim 1, wherein the second group of solder bumps and the increased diameter pillars are sized such that, in response to the second group of solder bumps melting, a surface tension between the second group of solder bumps and the increased diameter pillars pulls the contact pads and the pillars into alignment to compensate for initial misalignment and pulls the first group of solder bumps into contact with both the contact pads and the standard diameter pillars to compensate for warpage in the substrate.

4. The apparatus of claim 1, wherein the increased diameter pillars are each disposed toward an edge of the pattern of pillars on the integrated circuit device.

5. The apparatus of claim 1, wherein the increased diameter pillars are each disposed at a corner of the pattern of pillars on the integrated circuit device.

6. The apparatus of claim 1, wherein the solder bumps from the first and second groups of solder bumps are attached to at least one of a pillar and a contact pad prior to connection of the pillars and the contact pads.

7. The apparatus of claim 1, wherein solder bumps from the first and second groups of solder bumps are attached to each of the contact pads prior to connection, three or more solder bumps from the second group of solder bumps are attached to the increased diameter pillars prior to connection such that the three or more solder bumps fuse with opposing solder bumps on corresponding contact pads during connection, and a combined pre-connection height of the three or more solder bumps and the opposing solder bumps is greater than a pre-connection height of solder bumps from the first group of solder bumps.

8. The apparatus of claim 1, wherein the standard diameter pillars and the increased diameter pillars comprise copper.

9. The apparatus of claim 8, wherein the standard diameter pillars and the increased diameter pillars comprise a copper alloy.

10. The apparatus of claim 8, wherein the standard diameter pillars and the increased diameter pillars further comprise a surface layer of plating.

11. The apparatus of claim 1, wherein the substrate comprises an organic laminate.

12. A system to connect an integrated circuit device to a substrate, the system comprising:
   an integrated circuit device;
   a substrate opposite the integrated circuit device;
   a plurality of standard diameter electrically conductive pillars disposed on the integrated circuit device;
   three or more increased diameter electrically conductive pillars disposed on the integrated circuit device, the increased diameter pillars having a height that is similar to a height of the standard diameter pillars, the increased diameter pillars having a diameter that is greater than a diameter of the standard diameter pillars, the standard diameter pillars and the increased diameter pillars forming a pattern on the integrated circuit device, the pattern corresponding to a plurality of electrically conductive contact pads disposed on the substrate, the heights of the increased diameter pillars and the standard diameter pillars disposed on the integrated circuit device being greater than a height of the contact pads disposed on the substrate;
   a first group of solder bumps disposed between the standard diameter pillars and contact pads corresponding to the standard diameter pillars; and
   a second group of solder bumps disposed between the increased diameter pillars and contact pads corresponding to the increased diameter pillars, solder bumps in the second group of solder bumps having a pre-connection height that is greater than a pre-connection height of the first group of solder bumps, the greater pre-connection height of the second group of solder bumps pulling the first group of solder bumps into contact with both the contact pads and the standard diameter pillars in response to at least the second group of solder bumps melting.

13. The system of claim 12, wherein the second group of solder bumps comprises initial pre-connection contact points between the increased diameter pillars and the corresponding contact pads due to the greater pre-connection height of the second group of solder bumps.

14. The system of claim 12, wherein the second group of solder bumps and the increased diameter pillars are sized such that, in response to the second group of solder bumps melting, a surface tension between the second group of solder bumps and the increased diameter pillars pulls the contact pads and the pillars into alignment to compensate for initial misalignment and pulls the first group of solder bumps into contact with both the contact pads and the standard diameter pillars to compensate for warpage in the substrate.

15. The system of claim 12, wherein the increased diameter pillars are each disposed toward an edge of the pattern of pillars on the integrated circuit device.

16. The system of claim 12, wherein the increased diameter pillars are each disposed at a corner of the pattern of pillars on the integrated circuit device.

17. The system of claim 12, wherein the solder bumps from the first and second groups of solder bumps are attached to at least one of a pillar and a contact pad prior to connection of the pillars and the contact pads.

18. The system of claim 12, wherein solder bumps from the first and second groups of solder bumps are attached to each of the contact pads prior to connection, three or more solder bumps from the second group of solder bumps are attached to the increased diameter pillars prior to connection such that the three or more solder bumps fuse with opposing solder bumps on corresponding contact pads during connection, and a combined pre-connection height of the three or more solder bumps and the opposing solder bumps is greater than a pre-connection height of solder bumps from the first group of solder bumps.

19. The system of claim 12, wherein the standard diameter pillars and the increased diameter pillars comprise copper.

20. The system of claim 12, wherein the substrate comprises an organic laminate.

21. A method for connecting an integrated circuit device to a substrate, the method comprising:
connecting a plurality of standard diameter electrically conductive pillars to an integrated circuit device;
connecting three or more increased diameter electrically conductive pillars to the integrated circuit device, the increased diameter pillars having a height that is similar to a height of the standard diameter pillars, the increased diameter pillars having a diameter that is greater than a diameter of the standard diameter pillars, the standard diameter pillars and the increased diameter pillars forming a pattern on the integrated circuit device, the pattern corresponding to a plurality of electrically conductive contact pads disposed on a substrate opposite the integrated circuit device, the heights of the increased diameter pillars and the standard diameter pillars disposed on the integrated circuit device being greater than a height of the contact pads disposed on the substrate;
placing a first group of solder bumps between the standard diameter pillars and contact pads corresponding to the standard diameter pillars; and
placing a second group of solder bumps between the increased diameter pillars and contact pads corresponding to the increased diameter pillars, solder bumps in the second group of solder bumps having a pre-connection height that is greater than a pre-connection height of the first group of solder bumps, the greater pre-connection height of the second group of solder bumps pulling the first group of solder bumps into contact with both the contact pads and the standard diameter pillars in response to at least the second group of solder bumps melting.

22. The method of claim 21, further comprising placing the integrated circuit device upon the substrate, wherein the second group of solder bumps comprises initial pre-connection contact points between the increased diameter pillars and the corresponding contact pads to support the integrated circuit device upon the substrate.

23. The method of claim 21, further comprising melting the first and second groups of solder bumps, wherein the second group of solder bumps and the increased diameter pillars are sized such that, in response to the second group of solder bumps melting, a surface tension between the second group of solder bumps and the increased diameter pillars pulls the contact pads and the pillars into alignment to compensate for initial misalignment and pulls the first group of solder bumps into contact with both the contact pads and the standard diameter pillars to compensate for warpage in the substrate.

24. The method of claim 21, wherein the solder bumps from the first and second groups of solder bumps are attached to at least one of a pillar and a contact pad prior to connection of the pillars and the contact pads.

25. An apparatus to connect an integrated circuit device to a substrate, the apparatus comprising:
a plurality of standard diameter copper pillars disposed on an integrated circuit device;
four increased diameter copper pillars disposed on the integrated circuit device, the increased diameter pillars having a height that is similar to a height of the standard diameter pillars, the increased diameter pillars having a diameter that is greater than a diameter of the standard diameter pillars, the standard diameter pillars and the increased diameter pillars forming a pattern on the integrated circuit device with the increased diameter pillars disposed at a corner of the pattern, the pattern corresponding to a plurality of electrically conductive contact pads disposed on an organic laminate substrate opposite the integrated circuit device, the heights of the increased diameter pillars and the standard diameter pillars disposed on the integrated circuit device being greater than a height of the contact pads disposed on the substrate;
a first group of solder bumps disposed between the standard diameter pillars and contact pads corresponding to the standard diameter pillars; and
a second group of solder bumps disposed between the increased diameter pillars and contact pads corresponding to the increased diameter pillars, solder bumps in the second group of solder bumps having a pre-connection height that is greater than a pre-connection height of the first group of solder bumps such that the second group of solder bumps comprises initial pre-connection contact points between the increased diameter pillars and the corresponding contact pads, wherein the second group of solder bumps and the increased diameter pillars are sized such that, in response to at least the second group of solder bumps melting, the greater pre-connection height of the second group of solder bumps and a surface tension between the second group of solder bumps and the increased diameter pillars pull the contact pads and the pillars into alignment to compensate for initial misalignment of the integrated circuit device and pull the first group of solder bumps into contact with both the contact pads and the standard diameter pillars to compensate for warpage in the organic laminate substrate.

* * * * *